(12) United States Patent
Tollefsen et al.

(10) Patent No.: US 10,858,979 B2
(45) Date of Patent: Dec. 8, 2020

(54) ELECTRIC ENERGY GENERATING DEVICE

(71) Applicant: TEGMA AS, Kristiansand (NO)

(72) Inventors: Torleif A. Tollefsen, Drammen (NO);
Lars Andreas Larsson, Lier (NO);
Harald Borgen, Horten (NO)

(73) Assignee: Tegma AS, Kristiansand (NO)

( * ) Notice: Subject to any disclaimer, the term of this patent is extended or adjusted under 35 U.S.C. 154(b) by 0 days.

(21) Appl. No.: 16/499,879

(22) PCT Filed: Apr. 3, 2018

(86) PCT No.: PCT/EP2018/058463
§ 371 (c)(1),
(2) Date: Oct. 1, 2019

(87) PCT Pub. No.: WO2018/185087
PCT Pub. Date: Oct. 11, 2018

(65) Prior Publication Data
US 2020/0109653 A1    Apr. 9, 2020

(30) Foreign Application Priority Data

Apr. 3, 2017    (NO) .................................... 20170547

(51) Int. Cl.
*F01N 5/02* (2006.01)
*F01N 13/18* (2010.01)
(Continued)

(52) U.S. Cl.
CPC ......... *F01N 5/025* (2013.01); *F01N 13/1822* (2013.01); *F02C 6/18* (2013.01);
(Continued)

(58) Field of Classification Search
CPC .. F01N 5/025; F01N 13/1822; F01N 2590/02; F01N 2590/10; F01N 13/1811;
(Continued)

(56) References Cited

U.S. PATENT DOCUMENTS 4,540,064 A    9/1985  Fujimura
2010/0064695 A1    3/2010  Wilcoxon et al.
(Continued)

FOREIGN PATENT DOCUMENTS

DE    102006043139 A1    3/2008
DE    102011015262 A1    11/2011
(Continued)

*Primary Examiner* — Audrey K Bradley
*Assistant Examiner* — Edward Bushard
(74) *Attorney, Agent, or Firm* — Christian D. Abel

(57) ABSTRACT

Electric energy generating device (1) for installation to an exhaust conduit (2) in which an exhaust gas (9) is flowing, comprising: —a thermoelectric generator (3) comprising a hot side (4) and a cold side (5), —at least one hot side heat transfer loop (6) comprising a fluid conduit circuit having a thermal fluid circulating therein, and where the fluid conduit circuit comprises: —a first in section (7) n thermal contact with the hot side (4), —a second section (8) adapted to be in thermal contact with the exhaust gas (9), —a third section (10) and a fourth section (11), wherein the third section (10) and the fourth section (11) each comprises at least one vibrational damping part (12), wherein each of the at least one vibrational damping part (12) comprises a heat resistant and flexible tube integrated into the third section (10) and the fourth section (11) of the fluid conduit circuit.

16 Claims, 8 Drawing Sheets

(51) Int. Cl.
*F02C 6/18* (2006.01)
*F02C 7/00* (2006.01)
*F02G 5/02* (2006.01)
*H01L 35/30* (2006.01)

(52) U.S. Cl.
CPC ............ *F02C 7/00* (2013.01); *F02G 5/02* (2013.01); *H01L 35/30* (2013.01)

(58) Field of Classification Search
CPC ...... F01N 5/02; F02C 6/18; F02C 7/00; F02G 5/02; F02G 5/04; H01L 35/30; Y02T 10/12; B64D 33/06
See application file for complete search history.

(56) References Cited

U.S. PATENT DOCUMENTS

| | | |
|---|---|---|
| 2011/0131962 A1 | 6/2011 | Toi et al. |
| 2013/0152989 A1 | 6/2013 | Krinn et al. |
| 2016/0155920 A1 | 6/2016 | Kwak et al. |
| 2017/0288115 A1 | 10/2017 | Kwak et al. |

FOREIGN PATENT DOCUMENTS

| | | |
|---|---|---|
| EP | 1475532 A2 | 11/2004 |
| EP | 2324514 A2 | 5/2011 |
| JP | H 03177082 A | 8/1991 |
| JP | H10234194 A | 9/1998 |
| JP | 2010275976 A | 12/2010 |
| JP | 2015 148355 A | 8/2015 |
| WO | WO2016/003088 A1 | 1/2016 |
| WO | WO2016/189680 A1 | 12/2016 | ns
ELECTRIC ENERGY GENERATING DEVICE

TECHNICAL FIELD

The present invention relates to an electric energy generating device for installation to an exhaust conduit, thereby enabling the generation of electric energy from the exhaust of a combustion engine. More specifically, the invention relates to a device and system for damping of vibrations harmful to a thermoelectric generator arranged in connection with an exhaust conduit.

BACKGROUND ART

In the process of generating power, combustion engines produce large amounts of heat which is discharged from the engine as exhaust and ventilated to the outside environment through exhaust conduits. This heat is often not utilized for any specific cause, but simply wasted to the outside environment, representing a large inefficiency in a power generating process.

Thermoelectric generators are well suited for recycling this otherwise wasted source of energy, as they can be fitted in connection with exhaust conduits downstream of the combustion engine and produce electric power from the heat inherent in the exhaust gas.

Thermoelectric generators convert temperature differences into electric energy. A thermoelectric generator comprises a thermoelectric element exposed to a heat source on a hot side, with an opposite cold side of the element being exposed to a heat sink. The heat source and the heat sink may each comprise a heat exchanger with circulating fluid, for transporting heat to or away from the respectively hot or cold side of the thermoelectric element. A thermoelectric material lies in-between the hot and the cold side of the thermoelectric element, the thermoelectric material comprising negatively and positively charged semiconductors connected in a series circuit. Some thermoelectric elements may comprise only negatively or positively charged semiconductors, in which case an electric conductor is required to be fitted between each semiconductor to lead electricity from one side of the element to the other and thus form a circuit. The temperature difference between the hot and cold side causes an electric current to flow in the semiconductors and thereby the circuit, which can be exploited for purposes such as powering auxiliary devices on a ship, thereby increasing overall fuel efficiency.

Exhaust conduits are subject to vibrations caused by pulses emitted as high pressure exhaust gas is released from exhaust valves on combustion engines. For large combustion engines such as marine diesel motors on ships, or other types of engines on production facilities be they either land based or offshore, these pulses can be very large causing substantial fluctuations in pressure and movement in the exhaust conduit. However, even in relatively small systems comprising combustion engines, such as automobiles, vibrations can be substantial. Vibrations from other kinds of machinery or propulsion means, can also propagate to the exhaust system. Especially on floating vessels, ships motions and cavitation from propellers cause vibrations which propagate through the hull and to exhaust conduits. Large temperature differences are a source of expansion and contraction of parts in an exhaust system, resulting in movements in the exhaust conduits which can result in vibrations.

Vibrations are a major cause of fatigue in thermoelectric generators, as the thermoelectric materials employed are typically brittle, causing short life times and low reliability. Replacing thermoelectric generators is complicated, as their locations in exhaust conduits is often inaccessible and may necessitate the relevant combustion engine to be turned off causing down time. Reparations and down time can amount to large costs for ships, oil platforms and other production facilities which are frequently required to be up and running 24/7. For exhaust systems employing thermoelectric generators, it is therefore desirable to keep a frequency of replacement to the minimum.

There have been attempts to solve this problem in the prior art:

EP 2811142 A1 describes a system for converting waste heat from the exhaust of an automobile by using a thermoelectric generator. A combustion engine passes exhaust via a manifold to an exhaust pipe, on which are arranged a series of catalysts, after which the exhaust gas passes into an exhaust pipe portion running through a steam tank of a thermoelectric conversion module. Water in the steam tank is heated and delivered to the hot side of a thermoelectric generator, whose opposite side is exposed to a cooling medium. At the transition between the manifold and the exhaust pipe a spherical joint is fitted, allowing the manifold and exhaust pipe to swing moderately, and prevents or dampens vibrations and movements of the engine to the exhaust pipe. However, there is no mention of any arrangement to damp vibrations from exhaust pulses acting on the thermoelectric generator.

US 2016/0111622 relates to a flexible thermoelectric module apparatus, meant for mounting on an exhaust conduit. The problem of vibrations is solved by using flexible thermoelectric plates, which are adapted to be in contact with the outside surface of the exhaust conduit. A major drawback with using flexible thermoelectric materials is that they are inferior with respect to efficiency when compared to brittle thermoelectric materials.

US 2010/00095996 relates to a thermoelectric generator with an intermediate transfer loop between a surface exposed to the exhaust of an internal combustion engine and the hot side of a thermoelectric generator. There is not described any vibration dampening means.

US 2016/0155920 A1 discloses a thermoelectric generator system of an engine, where an electric energy generating device is arranged on a heat protective cover in which an exhaust gas is flowing, the device comprising;
  a thermoelectric generator arranged in between a hot heat spreader and a cold heat spreader. The document discloses a system and not a stand-alone device. Furthermore, the heat protective cover is arranged over an exhaust manifold, and the electric energy generating device is thus not for installation to an exhaust conduit. Also, US 2016/0155920 A1 discloses a graphite sheet arranged in-between the hot spreader and the thermoelectric generator, where the graphite sheet minimizes heat transfer and absorbs vibrations.

US 2013/0152989 A1 discloses a system comprising a thermoelectric generator arranged on an exhaust pipe. However, there is no vibrational damping element between the thermoelectric generator and the exhaust pipe. The damping element is arranged between heat sink tubes arranged externally to the thermoelectric generator, the generator being in direct contact with the exhaust pipe and is therefore not protected from the vibrations therein.

JPH 03177082 A and JP 2010275976 A also disclose systems similar to US 2013/0152989 A1, where a thermoelectric generator where the damping element is arranged on the cold side of the generator, and not between the generator and exhaust pipe/heat source.

JPH 10234194 A discloses a system comprising a thermoelectric generator arranged on an exhaust pipe. A vibrational damping element is arranged between the exhaust pipe and the thermoelectric generator to protect the generator from vibrations.

None of the devices or systems known from the prior art show a device which may be employed or easily installed in a range of different exhaust outlets, with sufficient damping of vibrations to increase the lifetime of a thermoelectric generator.

Therefore, there is need for a system with improved damping means for thermoelectric generators.

SUMMARY OF THE INVENTION

With the abovementioned challenges and known solutions in mind, the present invention brings forward a device and system for damping vibrations on thermoelectric generators installed to exhaust conduits.

Thus, it may be advantageous to provide an electric energy generating device comprising a heat transfer loop in thermal communication with a thermoelectric generator and adapted for arrangement in an exhaust conduit, where the loop is vibrationally damped.

More specifically, it may be advantageous to provide an electric energy generating device comprising a thermoelectric generator with thermoelectric materials that are optimized for high temperature gradients and efficiency by employing a thermal fluid in the heat transfer loop.

Furthermore, it may be advantageous to provide an electric energy generating device which can easily be installed in an exhaust conduit, and is adapted to utilize pre-existing entities, such as heat exchangers in a surrounding system.

Furthermore, it may be advantageous to provide a heat transfer loop with optimal shape and size for heat transfer between the thermoelectric generator and the exhaust gas.

Furthermore, it may be advantageous to minimize pressure loss and temperature drop of the exhaust gas.

Furthermore, it may be advantageous to prevent an accumulation of soot and particles from exhaust gases accumulating on the heat transferring device.

The present invention provides significant improvements in relation to known solutions, as a thermoelectric generator comprising thermoelectric materials adapted for high temperature gradients and efficiency can be isolated from harmful vibrations in an exhaust conduit.

Accordingly, the present invention relates to an electric energy generating device for installation to an exhaust conduit in which an exhaust gas is flowing, the device comprising;
- a thermoelectric generator comprising a hot side and a cold side,
- at least one hot side heat transfer loop comprising a fluid conduit circuit having a thermal fluid circulating therein, and where the fluid conduit circuit comprises;
  - a first section in thermal contact with the hot side of the thermoelectric generator,
  - a second section adapted to be in thermal contact with the exhaust gas,
  - a third section located between the first section and the second section upstream of the first section and a fourth section located between the first section and the second section downstream of the first section, wherein the third section and the fourth section comprises at least one vibrational damping part, wherein
    - each of the at least one vibrational damping part comprises a heat resistant and flexible tube integrated into the third section and the fourth section of the fluid conduit circuit.

Thus, an electric energy generating device can be pre-installed or retrofitted to an exhaust conduit, where a vibrational damping part of the hot side heat transfer loop ensures that vibrations propagating to the thermoelectric generator are minimized or eliminated. This allows a wider range of thermoelectric generators to be used, especially brittle, but highly efficient thermoelectric materials that can be exposed to high temperature gradients. The brittleness of a thermoelectric generators thermoelectric material may be dependent on the operating temperature of its environment, and is preferentially designed to be optimized according to its use, as will be apparent to the person skilled in the art based on the disclosure of the invention herein. Another beneficial aspect of the invention is its wide applicability, as electric energy generating devices can be mounted in various exhaust conduits such as on ships, offshore structures, automobiles, processing plants. In aspects of the invention, the hot side heat transfer loop may be a pre-existing loop, such as the heat exchanger loop of an economizer. The invention is advantageously adaptable to be installed on a variety of different exhaust systems, and will thus be configured accordingly as will be apparent based on the disclosure herein. The third and fourth sections may have one, or several vibrational damping parts according to what dampens vibrations most effectively and is most suited to the pre-existing system. Thermoelectric generators are herein defined as solid state devices that convert temperature differences directly into electrical energy. The thermal fluid may comprise a thermal oil, or any other fluid suitable for use in heat transferring purposes as will be apparent to the person skilled in the art based on the disclosure of the invention herein. A heat transfer loop with a thermal fluid advantageously allows for improved efficiency in the rate of heat exchange between a thermoelectric generator and the exhaust gas, as the fluid carries heat from the exhaust gas to the thermoelectric generator, thereby accelerating the rate of heat exchange.

In aspects of the invention, thermal contact between the first section and the hot side of the thermoelectric generator may for example imply that there is a heat transfer coefficient of 10000-25000 W/m²K between the thermal fluid condensing in the first section and the hot side of the thermoelectric generator, where the thermal fluid may for example comprise DOWTHERM™ A or any other suitable thermal fluid with similar properties for evaporation and condensation as are known in the art. The heat transfer coefficient between the between the thermal fluid condensing in the first section and the hot side of the thermoelectric generator may be dependent on such factors as orientation of the conduit in which condensation occurs and the temperature difference between the gas and the condensation surface.

Between the thermal fluid evaporating in the second section and the exhaust gas, thermal contact may for example imply that there is a heat transfer coefficient preferably in the range of 40-150 W/m²K, where the thermal fluid may for example comprise DOWTHERM™ A. The heat transfer coefficient may in these aspects be dependent on such factors as the mass flow and velocity of the exhaust gas. The mass flow of the exhaust gas may in aspects be in the range of 7-15 kg/s, and the velocity in the range of 18-35 m/s.

In aspects of the invention, a thermal fluid may be used which does not evaporate and condense in the heat transfer loop, such a thermal fluid may for example comprise DURATHERM 630 or any other suitable thermal fluid with similar properties as are known in the art. In these aspects, thermal contact between the exhaust gas and the thermal fluid in the second section may for example imply that there is a heat transfer coefficient preferably in the range of 100-200 W/m$^2$K at standard conditions, where the thermal fluid may for example comprise DOWTHERM™ A. The heat transfer coefficient may in these aspects be dependent on such factors as the pressure drip and velocity of the exhaust gas, and may for example be in the range of 20-45 m/s.

Preferably the aforementioned heat transfer coefficients being at standard conditions where little or no fouling of the second section due to an isolating layer of soot particles is present.

As will be apparent to the person skilled in the art, the thermal heat coefficient may be dependent on the volume flow, temperature differences in the loop, type of thermal fluid etc.

The heat resistant and flexible tube thus advantageously dampens vibrations from the exhaust conduit and shields the thermoelectric generator. Preferably, the vibrational damping part comprises a heat resistant tube suitable for operating at temperatures up to 500 degrees Celsius, even more preferably in the range of 250-350 degrees Celsius, for example 300 degrees Celsius. Furthermore, the vibrational damping part comprises a flexible tube capable of vibrating with an amplitude of 0-20 mm, preferably no more than 1-8 mm, for example 4 mm.

In aspects of the invention the heat resistant and flexible tube may comprise the entire length of the third section and the fourth section. In other aspects of the invention, the sections may comprise a plurality of tubes spaced at axially spaced intervals with regular fluid conduits between. In further aspects of the invention, the vibrational damping part may comprise vibrational damping devices which may be connected to the third section and fourth section, such as elastic materials fitted around the sections or other similar devices.

In an aspect of the invention, the fluid conduit circuit may comprise a control valve. Advantageously, a control valve may control the flow rate of thermal fluid circulated from the second section to the first section in the fluid conduit circuit. Some exhaust gases may vary in temperature, for example, in ships an electric energy generating device may typically be installed in an area of an exhaust conduit where exhaust gas temperature is for example 300-380 degrees Celsius. However, during periods where a higher engine exertion is required, the exhaust gas temperature may rise by for example 20 degrees Celsius. For many thermoelectric generators, such a rise in temperature may not be feasible. Typically, cheaper and off-the shelf thermoelectric generators may be damaged if exposed to a temperature above for example 250 degrees Celsius. Preferably, a control valve may therefore be linked to at least one temperature sensor, which is coupled to a control unit. The temperature sensors may in some aspects be arranged to measure temperature of any of the thermal fluid, thermoelectric generator and exhaust gas. The control unit may then signal to the control valve to decrease the flow rate of heated thermal fluid flow from the second section to the first section. In other aspects of the invention, the control valve may be manually operated when a temperature limit is reached and the control unit sends a signal visible to an operator. Thus, a thermoelectric generator may be chosen which is optimized for a certain temperature and rate of flow, without requiring to be dimensioned for a maximum temperature and rate of flow. Such an optimized thermoelectric generator may thus provide superior efficiency.

In aspects of the invention, the control valve may be arranged on the third section. Thus, the control valve may regulate pressure and volume flow entering the first section, and may also be used to build up pressure in the second section such that thermal fluid from a receiver tank arranged on the fourth section is pushed back into the first section to cool it down.

In aspects of the invention, the control valve may be arranged on the fourth section. Thus, the control valve may effect pressure build up in the first section, thereby causing a buildup of liquid which may increase thermal resistance to the hot side of the thermoelectric generator, protecting it from reaching an excessive temperature.

In aspects of the invention, the control valve may be regulated by a control unit connected to the second section. Thus, the control unit may measure any of temperature, pressure and volume flow at the second section to determine whether the control valve should be actuated.

In aspects of the invention, the control valve may be regulated by a control unit connected to the third section. Thus, the control unit may measure any of temperature, pressure and volume flow at the third section to determine whether the control valve should be actuated.

In aspects, several control valves may be arranged on the same or different sections. Thus, the device may achieve higher redundancy, and/or the different means of regulating temperature in the thermoelectric generator may be used, depending on what is most expedient.

In aspects of the invention, the control unit may be arranged to measure any of temperature, volume flow or pressure of the thermal fluid. The control unit may thus comprise a thermostat with a bimetal, a pressure controlled spring valve or any similar means known in the art to regulate pressure, temperature and/or volume flow or combinations, and with a limit which may be calibrated in each case as will be apparent to the person skilled in the art based on the disclosure of the invention herein. A plurality of control units may be arranged on the same or different section, to achieve redundancy and more exact measurements.

In an aspect of the invention, the third section and the fourth section may each comprise at least one connection device to connect the third section and fourth section to a surface external to the device and exhaust conduit. The connection devices are advantageously not connected to the surfaces of the device or the exhaust conduit so as to prevent vibrations from the exhaust conduit from spreading to the thermoelectric generator. The surfaces may be a wall, floor, ceiling or any other surfaces external to the device and exhaust conduit. In aspects of the invention, the third and fourth section may share one connection device connecting them to an external surface. For a plurality of connection devices, they may be connected to the same or different surfaces according to the most suitable configuration.

In an aspect of the invention, each of the at least one connection device may comprise a vibrational damping portion. The hot side heat transfer loops is thus further dampened from vibrations from the exhaust conduit. In aspects, only some connection devices may be vibrationally damped, whilst others do not comprise vibrational damping portion. In some aspects, the vibrational damping portion may comprise a vibrational damping material, such as polyester, polymers, elastic metals or other well-known damping materials. In aspects of the invention, the vibrational damping portion may comprise a part of the connection device adjacent to the surface of which it is connected. In other aspects the portion may include the entire connection device.

In an aspect of the invention, the at least one hot side heat transfer loop may comprise a fluid pumping device for circulating a thermal fluid contained in the loop. Pumping the fluid advantageously provides faster rates of thermal exchange between the exhaust gas and a thermoelectric generator.

In an aspect of the invention, the at least one hot side heat transfer loop may comprise an expansion tank in thermal communication with the fluid conduit circuit. An expansion tank may be advantageous as the volume of the thermal fluid can be dependent on its temperature, the expansion tank will therefore accommodate the changes in volume of the thermal fluid. The expansion tank in aspects comprise a receiver tank, where thermal fluid may be stored and which may facilitate thermal fluid flowing back to the first section due to pressure build up in the second section.

In an aspect of the invention, the third section and fourth section may be adapted to be arranged externally to the exhaust conduit. The heat transfer loop may thus have different sections advantageously comprising different materials, shapes and sizes tailored for the specific purpose and environment.

In an aspect of the invention, the third section and fourth section may be thermally insulated. Advantageously this reduces the temperature loss to the surroundings as thermal fluid is circulated in the loop, ensuring that the temperature difference of the thermal fluid when it re-enters the second section, compared to the exhaust gas is around 15-20%. As the fluid requires a relatively low temperature increase, the length and size of the second section of the hot side heat transfer loop can be minimized, thereby minimizing pressure loss and temperature drop of the exhaust gas. This may be preferable, as other systems downstream of an electric energy generating device, such as scrubbers, may be powered by the temperature and pressure of the exhaust gas. Advantageously this may enable the electric energy generating device to be fitted in systems which require a minimal pressure and temperature loss.

In an aspect of the invention, the second section may comprise a steel alloy. Advantageously steel alloys are stable at high temperatures and resistant to corrosion. In other aspects of the invention other alloys such as Copper, Copper-Nickel, Titanium and stainless steel may be used depending on desired degree of thermal conductivity or corrosion resistance, as will be apparent to the skilled person based on the disclosure of the invention herein.

In an aspect of the invention, the at least one hot side heat transfer loop may be a heat pipe. Advantageously, the thermal fluid will thus circulate within the fluid conduit circuit by thermal convection. At the second section, the thermal fluid evaporates to gas due to the heat conveyed from the exhaust gas, and at the first section the thermal fluid condenses as it releases heat to the hot side of the thermoelectric generator.

In an aspect of the invention, the first section may be arranged above the second section in relation to a gravitational field. Thus, the thermal fluid evaporating at the first section will rise up to the second section, where it condenses, and flows down by virtue of gravity to the second section again.

In an aspect of the invention, the second section may be adapted to be arranged externally to the exhaust conduit. Advantageously, this may avoid fouling on the second section, and decrease pressure drop of the exhaust gas, the second section may furthermore be easier to install. However, this aspect may not be less efficient as thermal resistance increases between the exhaust gas and the fluid circulating in the second section.

In an aspect of the invention, the second section may be in thermal contact with at least one heat exchanging element, the heat exchanging element being adapted to extend internally into the exhaust conduit, such that the at least one heat exchanging element is directly exposed to the exhaust gas.

In an aspect of the invention, the heat exchanging element adapted to extend internally into the exhaust conduit may comprise plates, pipes, rods, fins or any other projecting element in any shape such as rectangular, circular, cubic etc. The heat exchanging element may also comprise a thermal fluid circulating therein, such as in a heat pipe.

In an aspect of the invention, at least one first part of the second section may be adapted to extend internally into the exhaust conduit, such that the at least one first part of the second section is directly exposed to the exhaust gas. The direct contact between the loop and exhaust gas gives an advantageously efficient heat exchange.

In an aspect of the invention, the surface of the second section's at least one first part comprises any of: plates, fins, turbulator wires and heat pipes. The surface of the second section's at least one first part is thus preferably designed with a shape to optimize heat transfer between the thermal fluid and the exhaust gas by increasing the effective area of the second sections outer surface. These shapes are also configured to induce turbulence by disrupting laminar flow of exhaust gas thereby increasing the heat transmission coefficient between exhaust gas and the second section. Further aspects of turbulence inducing configurations may thus comprise any of: a rough surface, a ridge or any other turbulence inducing shapes that will be apparent to the person skilled in the art based on the disclosure of the invention herein. Advantageously, the second section may also be designed to minimize temperature and pressure loss in the exhaust gas.

In an aspect of the invention, the second section's at least one first part may comprise a catalytic material for preventing accumulation of particles from the exhaust. Advantageously, this avoids a build-up of particles on the loop exposed to exhaust gases, as accumulated matter—especially soot, may form an isolating layer reducing the rate of heat transfer between the exhaust gas and the thermal fluid. The catalytic surface layer may comprise any material known to have this effect, as will be apparent to the person skilled in the art given the disclosure of the invention herein.

In an aspect of the invention, the second section's at least one first part may comprise a substantially spiraled shape. Preferably, the second section's at least one first part may comprise a substantially coiled or spiraled shape, or any other shape which increases the total length of loop that may be exposed to exhaust gas, as will be familiar to the person skilled in the art based on the disclosure of the invention herein. Though the shape of the loop may be designed for more efficient heat exchange, the choice of shape may be required to be weighed up against a need to minimize pressure and temperature loss of the exhaust gas.

In an aspect of the invention, at least one second part of the second section may be adapted to any of: lie inside a wall of the exhaust conduit and lie against an external wall of the exhaust conduit, such that the at least one second part is not directly exposed to the exhaust gas. The aspects of the invention according to these configurations may be preferable in certain exhaust systems, depending on the layout of the exhaust conduit and other pre-existing systems.

In an aspect of the invention, at least one turbulence inducing device is arranged on an internal wall of the exhaust conduit adjacent or directly upstream to the second section. In aspects where the second section lies substantially along the wall of the exhaust conduit, turbulence inducing devices are advantageously arranged upstream and parallel to the second section to disrupt laminar flow along the wall of the exhaust conduit. These turbulence inducing devices may comprise turbulator wires or any similar devices which will be apparent to the skilled person based on the disclosure of the invention herein.

In an aspect of the invention, a plurality of hot side heat transfer loops may be fluidly isolated from each other. Advantageously, a plurality of independent loops can provide a greater volume of fluid being circulated between the second section of the loop exposed to exhaust and the thermoelectric generator, thereby increasing heat exchange. A plurality of loops also increases the reliability of the system as parallel loops give more redundancy. In other aspects of the invention, a plurality of loops may be in fluid communication with each other. The configuration of the loops will be adapted to each exhaust system as the skilled person will understand based on the disclosure of the invention herein.

In an aspect of the invention, the device may further comprise;
  at least one cold side heat transfer loop arranged on the cold side of the thermoelectric generator and in thermal communication with a cooling reservoir. The cold side heat transfer loop being in thermal contact with the cold side of the thermoelectric generator. Thermal contact may for example imply that there is a heat transfer coefficient preferably in the range of 750-15000 $W/m^2K$. The conditions for such heat transfer coefficient being for example that the cold side heat transfer loop comprises water with an inlet temperature of 18 K below the temperature of the thermoelectric generator and a volume flow of 3.4 liters per minute. And the cold side of the thermoelectric generator may for example comprise a 9 mm aluminum base on which cooling fins are arranged spaced at between 1-4 mm intervals, with a thickness of 6 mm and a height of 20 mm. As will be apparent to the person skilled in the art, the thermal heat transfer coefficient may be dependent on the volume flow and temperature difference, and a range of other factors. Cooling the cold side of the thermoelectric generator maintains a high temperature gradient across the generator, and thus allows for higher efficiency. Advantageously, the at least one cold side heat transfer loop also contains a thermal fluid, preferably water, circulating between the cold side of the thermoelectric generator and a cooling reservoir. The cold side heat transfer loop may be thermally isolated, dependent on the benefit of potential lost effectivity of the thermoelectric generator versus the cost of isolating the loop. A cooling reservoir may advantageously comprise a reservoir adapted to dissipate heat, so that heated fluid coming from the thermoelectric generator is cooled before being circulated back to the generator. In other aspects of the invention, the cold side heat transfer loop can be arranged for direct thermal communication with a heat exchanger, without a cooling reservoir, as will be evident to the skilled person based on the disclosure of the invention herein.

In an aspect of the invention, the at least one cold side heat transfer loop may comprise a fluid pumping device for circulating a thermal fluid contained in the loop. Pumping may provide faster rates of thermal exchange between the cooling reservoir and the thermoelectric generator.

In an aspect of the invention, a plurality of cold side heat transfer loops may be fluidly isolated from each other. A plurality of independent loops may provide a greater volume of fluid being circulated between the cooling reservoir and thermoelectric generator, thereby increasing heat exchange. A plurality of loops also increases the reliability of the system as parallel loops gives more redundancy. In other aspects of the invention, a plurality of loops may be in fluid communication with each other. The configuration of the loops will be adapted to each exhaust system as the skilled person will understand based on the disclosure of the invention herein.

In an aspect of the invention, the cooling reservoir may be adapted to be arranged in thermal communication with a heat exchanger external to the device. To ensure rapid cooling of the fluid in the cooling reservoir, it may be advantageous to arrange a cooling reservoir so that heat can be transferred away by a heat exchanger external to the electric energy generating device. As an electric energy generating device typically may be installed in larger systems which already comprise heat exchangers for other purposes, a cooling reservoir may be connected to these, depending on a heat exchangers available capacity. As an example, ships and other structures located on or by water, typically use ambient water to cool systems on board via a heat exchanger. In another example, automobiles often have an inherent cooling system and heat exchangers, which may be coupled to a cooling reservoir. In yet a further example, land based processing plants may be installed with a heat exchanger using publicly available water, which may then be connected to a cooling reservoir.

The invention further relates to a system for generating electric power from the exhaust of a combustion engine, comprising at least one electric energy generating device according to any of the abovementioned aspects. An electric energy generating device is thus especially suited to be arranged in a system, where the at least one electric energy generating device is installed in an exhaust conduit.

In an aspect of the invention, the system may comprise a heat exchanger in thermal communication with the cooling reservoir of the device.

In an aspect of the invention, the system may comprise several electric energy generating devices arranged substantially longitudinally parallel and/or substantially in a downstream extending series in the exhaust conduit. Arranging thermoelectric generators in parallel or series may be advantageous as several generators may be able to deliver a higher efficiency compared to one relatively large generator. The reliability of the system is also advantageously increased as a plurality of devices gives more redundancy. Furthermore, the number of loops may be used to tune the total desired voltage output produced by the different devices.

Throughout the description and claims different words and terms are used, the definitions of these and other characteristics of the invention will be clear from the following description of a preferential form of embodiment, given as a non-restrictive example, with reference to the attached drawings wherein;

DETAILED DESCRIPTION OF THE INVENTION

The inventive concept will now be described more fully hereinafter with reference to the accompanying drawings.

Figure 1:
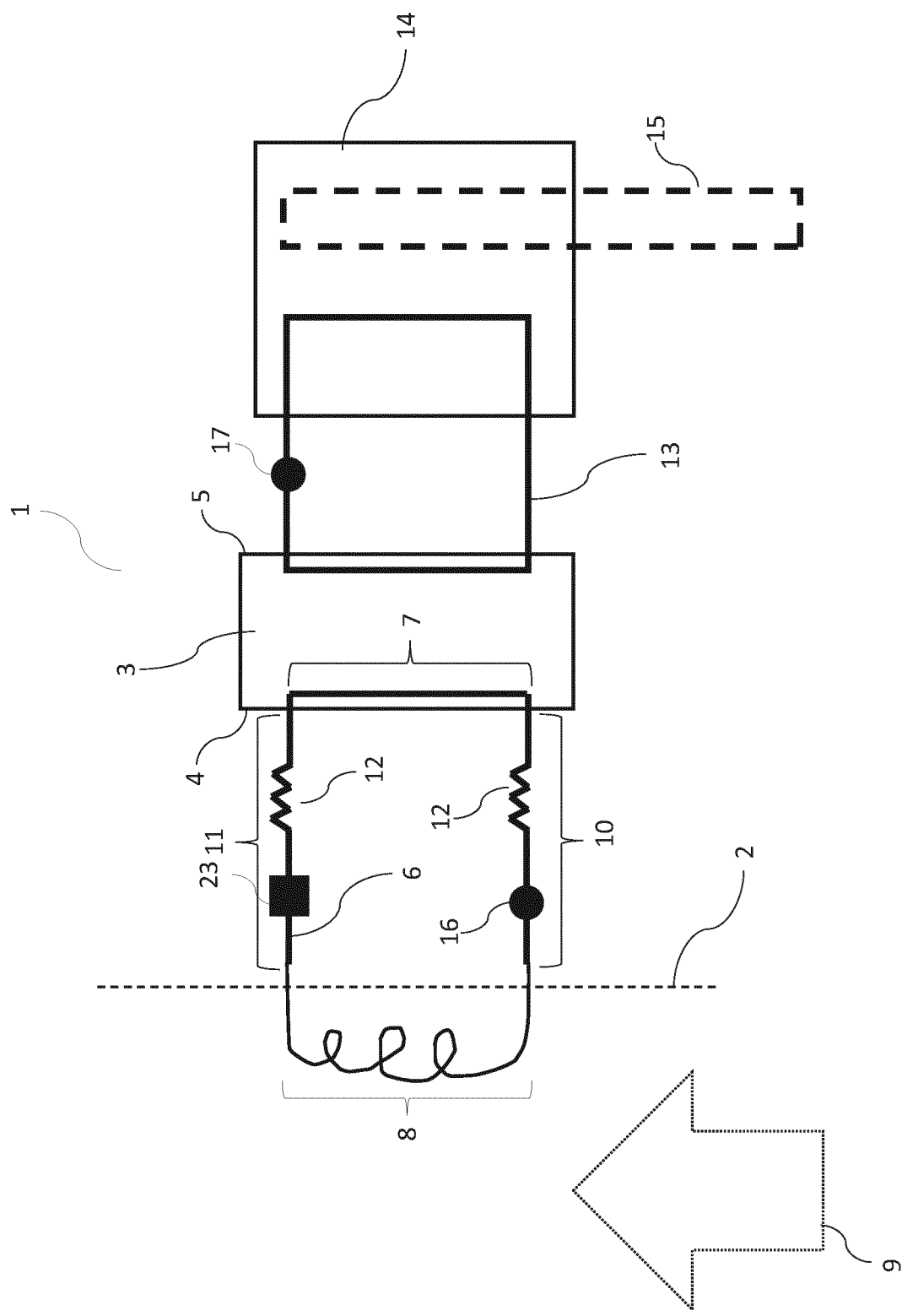
FIG. 1 schematically illustrates an aspect of the invention, where an electric energy generating device is installed in an exhaust conduit.
Figure 4:
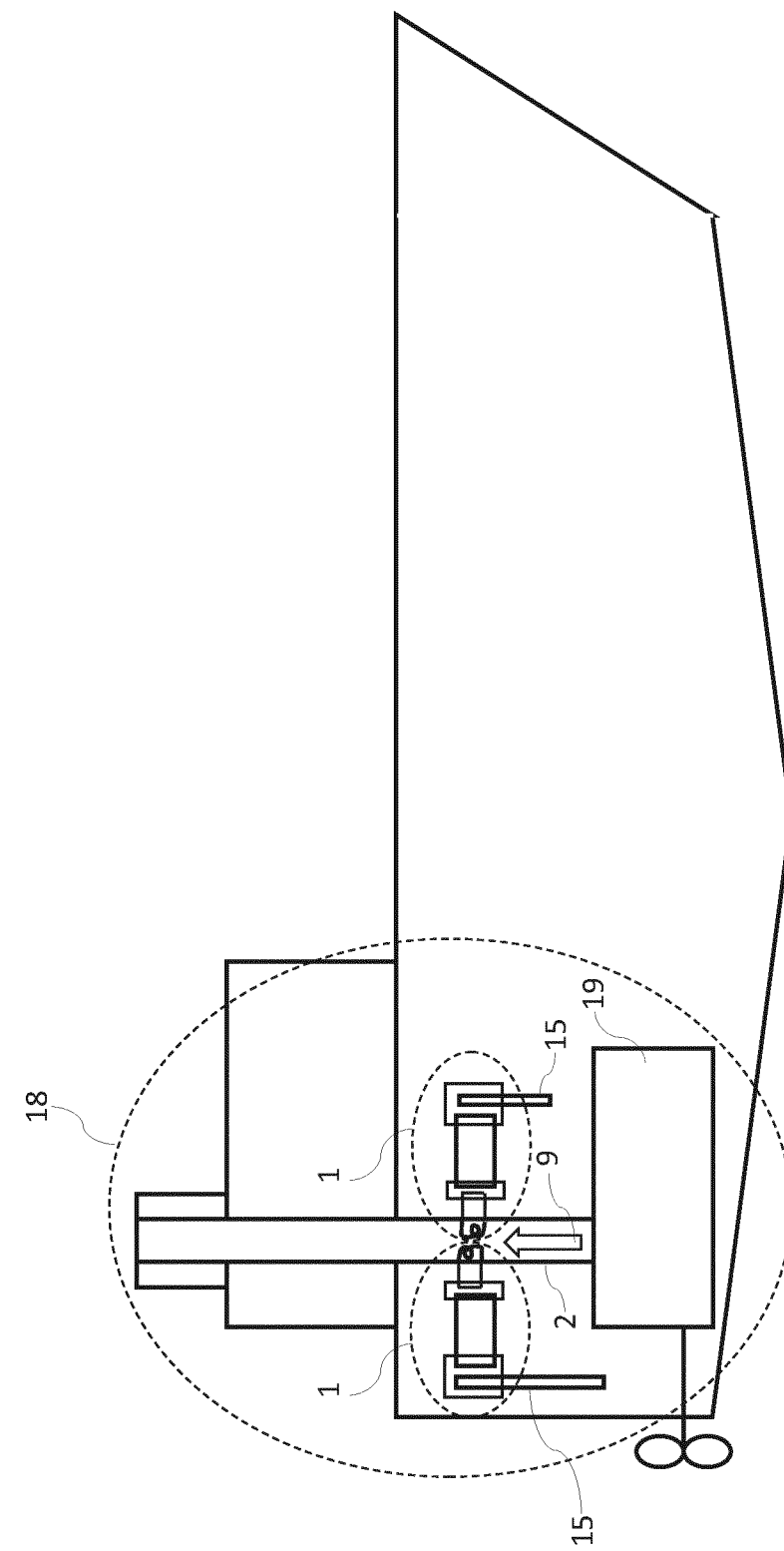
FIG. 4 schematically illustrates an aspect of the invention, where a system for generating electric power from the exhaust of a combustion engine, comprises two electric energy generating devices in an exhaust conduit of a system exemplified as a ship.

In FIG. 1 an aspect of the invention is shown where an electric energy generating device 1 is installed in an external system 18 (see FIG. 4 where the external features are represented by dashed lines). A thermoelectric generator 3 is thus shown in an aspect where the generator 3 is installed in connection with an exhaust conduit 2. A heat transfer loop 6 runs from a hot side 4 of the generator 3 and through the inside of the exhaust conduit 2 so that the loop is exposed to exhaust gases 9. Another heat transfer loop 13 is arranged on an opposite, cold side 5 of the generator 3, and runs through a cooling reservoir 14. Both the hot side heat transfer loop 6 and the cold side heat transfer loop 13 comprise a fluid conduit circuit containing a thermal fluid. The fluid conduit may comprise any pipe, tube or other suitable conduit as will be apparent to the skilled person based on the disclosure of the invention herein. The hot side heat transfer loop 6 is partitioned into four sections; a first section 7 arranged on the hot side of the thermoelectric generator 3, a second section 8 on the opposing side of the loop 6 at a distance away from the generator 3 and adapted to be arranged inside an exhaust conduit 2, a third section 10 and a fourth section 11 extending between the first section 7 and the second section 8.

When thermal fluid is circulated in the heat transfer loop 6 it will circulate from the second section 8 via the third section 10 to the first section 7 and then back to the second section 8 via the fourth section 11. The third section 10 is arranged upstream of the first section 7 and the fourth section 11 is arranged downstream of the first section 7. Consequently, in the heat transfer loop 6 the third and fourth sections 10, 11 separate the first section 7 from the second section 8.

The thermal fluid inside the hot side heat transfer loop 6 absorbs heat when running through the second section 8, which is exposed to warm exhaust gases 9, and transports this heat to the hot side 4 of the thermoelectric generator 3 where the fluid is cooled down. The fluid in the hot side heat transfer loop 6 is cooled as heat is conducted across the thermoelectric generator 3 to the cold side 5.

Figure 2:
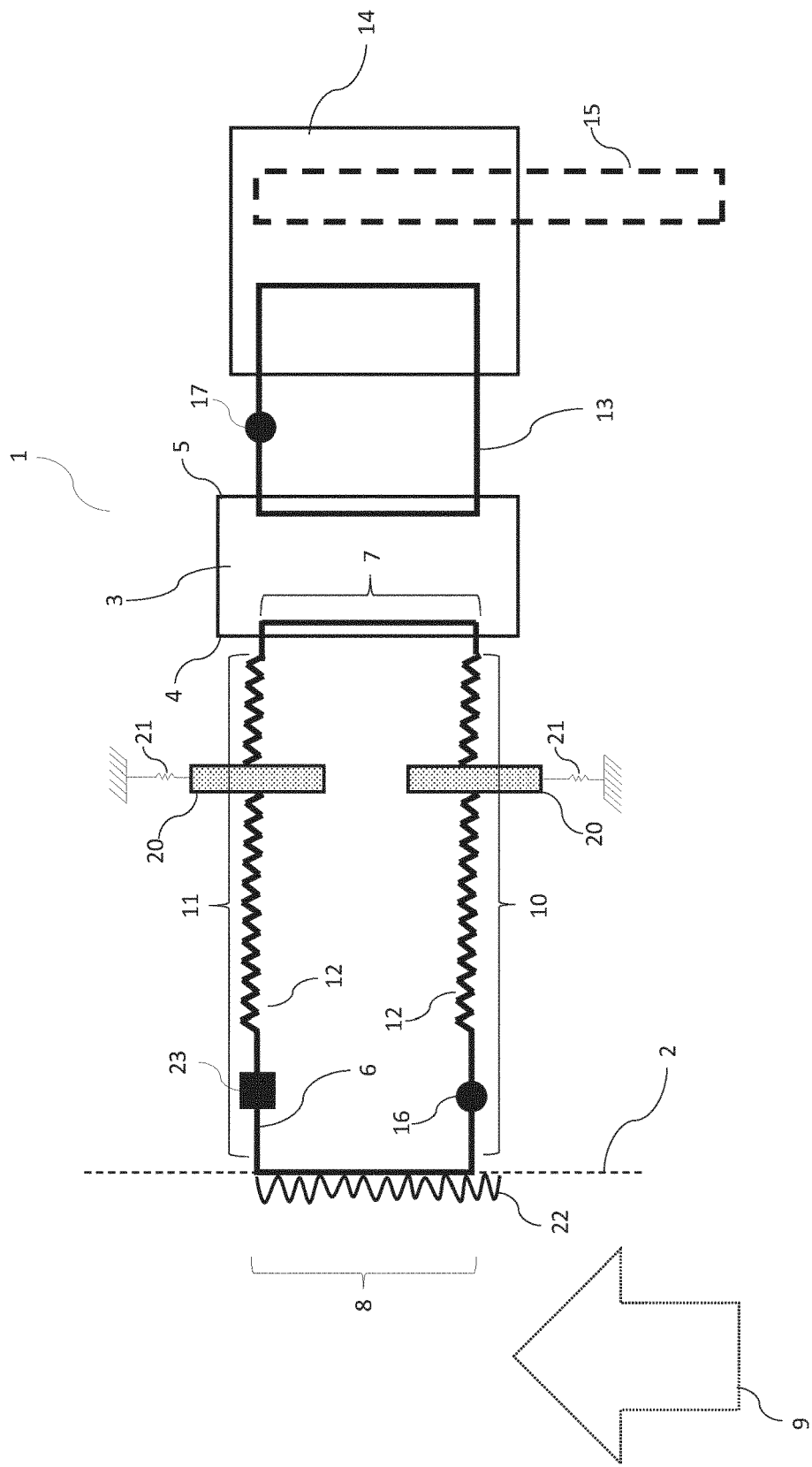
FIG. 2 schematically illustrates an aspect of the invention, where an electric energy generating device is installed in an exhaust conduit with a second section running along the conduit wall.

Simultaneously, the thermal fluid inside the cold side heat transfer loop 13 absorbs heat when running past the cold side 5 of the thermoelectric generator 3, and transports the heat to a cooling reservoir 14 where the fluid is cooled before being circulated back to the generator 3 again. Thus, a temperature gradient is sustained across the thermoelectric generator 3, which consequently produces an electric current. To improve the circulation of the thermal fluid, pumps 16, 17 may be arranged on the heat transfer loops 6, 13 as illustrated in the figures. The location of the pumps 16, 17 may be in any suitable location along the loops 6, 13, as will be obvious to the person skilled in the art based on the description of the invention herein. An expansion tank, or receiver tank 23 is also illustrated in FIGS. 2 and 3, the location of the expansion tank 23 also being at any suitable place along the loops 6, 13.

Figure 3:
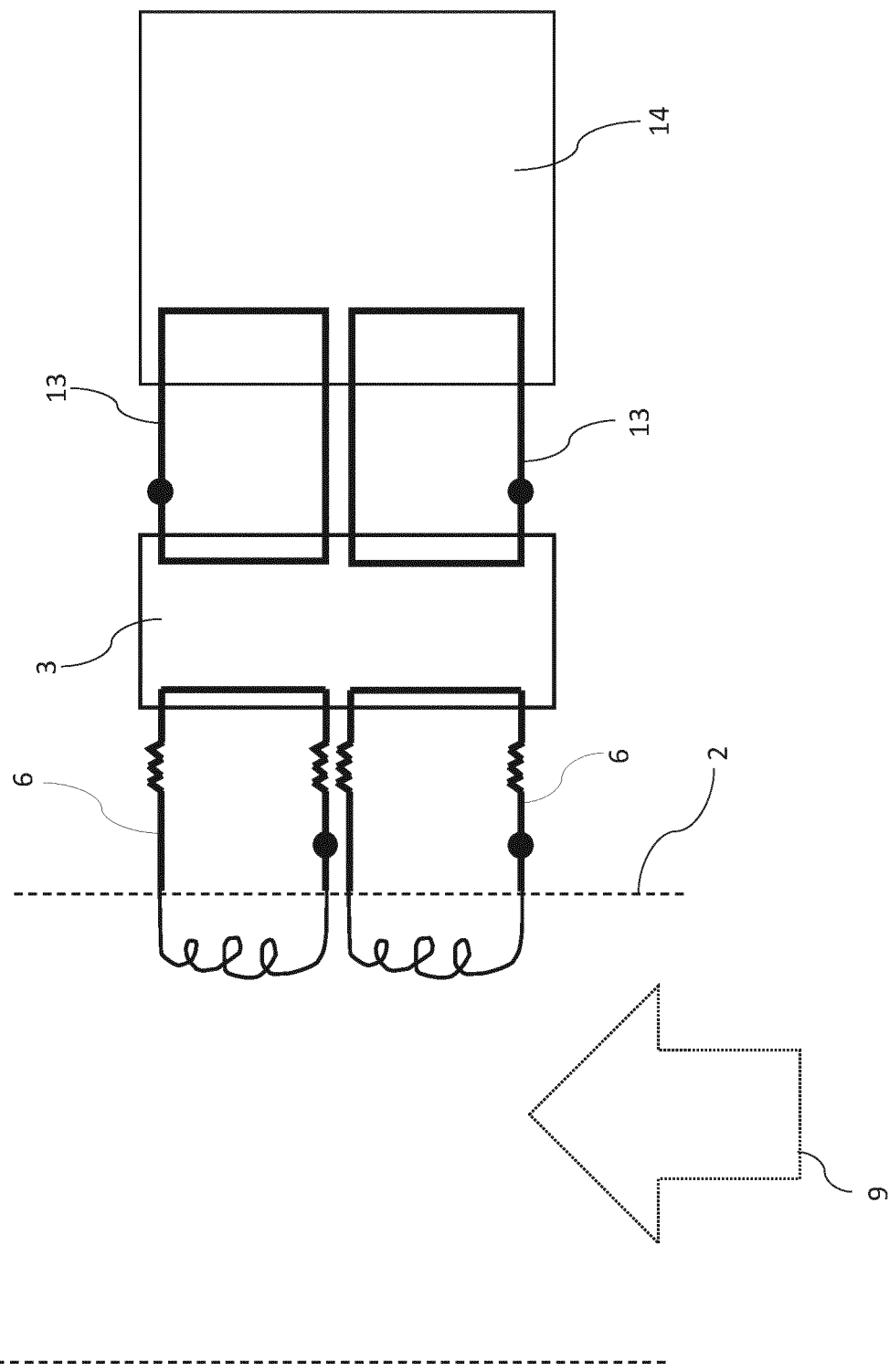
FIG. 3 schematically illustrates an aspect of the invention, where an electric energy generating device comprises a plurality of heat transfer loops.

The second section 8 is exemplified with a substantially spiraled shape extending into the interior of the exhaust conduit 2 in FIGS. 1 and 3, though the shape may vary according to what is most suited to the existing exhaust conduit 2. Though not illustrated herein, the second section 8 may be arranged with an outer surface comprising turbulence inducing devices and shapes, such as fins, turbulator wires, heat pipes, roughened surface, ridges and other means to disrupt the formation of a boundary layer of exhaust gas 9 and create a greater area of the surface exposed to exhaust gas 9. To prevent the formation of an insulating layer of particles on the second section 8, such as soot, the second section's 8 outer surface comprises a catalytic layer.

The hot side heat transfer loop 6 is thermally insulated to prevent heat loss to the external surroundings. To protect the thermoelectric generator 3 from vibrations propagating through the third section 10 and fourth section 11 of the hot side heat transfer loop 6, vibrational damping parts 12 are arranged along these sections 10, 11.

The vibrational damping parts 12 may comprise a heat resistant and flexible tube, and may as an example extend along the entire third section 10 and fourth section 11 respectively. Alternatively the vibrational damping 12 part may constitute 5% to 100%, e.g. 5%, 10%, 15%, 20%, 25%, 30%, 35%, 40%, 45%, 50%, 55%, 60%, 65%, 70%, 75%, 80%, 85%, 90%, 95% or 100%, of the length of the third 10 or fourth section 11 respectively. The heat resistant and flexible tube may as an example comprise a convoluted core with a wire over braid, the core being produced from stainless steel or nickel alloy sheet with annular or spiral convolutions, though any similar heat resistant and flexible tube may be used as will be apparent to the person skilled in the art based on the disclosure of the invention herein. In certain aspects of the invention, for example on ships exhaust systems, the vibrational damping part may comprise metallic flexible hoses such as the ones marketed by Belman.

Illustrated by the dashed line, an external heat exchanger 15 can be arranged to transport heat away from the cooling reservoir 14. In another aspect, not illustrated herein, an external heat exchanger 15 may be in direct thermal communication with the cold side heat transfer loop 13. Depending on the existing exhaust system where the electric energy generating device 1 is to be installed, the device may accordingly employ the pre-existing features of the system.

FIG. 2 illustrates an aspect of the invention, where the second section 8 of the heat transfer loop 6 is arranged along the wall of the exhaust conduit 2. In aspects of the invention, the second section 8 is arranged along the inside of the exhaust conduit 2 wall, integrated into the exhaust conduit 2 wall or along the outside of the exhaust conduit 2 wall. The second section 8 may in some aspects be arranged to varying degrees inside, outside or alongside the exhaust conduit 2 wall as described above, but will in all aspects be in thermal contact with the exhaust gas 9. As illustrated in FIG. 2, a turbulence inducing device 22, exemplified as a turbulator wire, is arranged alongside the second section 8 on the inside of the exhaust conduit 2 wall. The turbulence inducing device 22 may be arranged substantially parallel or upstream to the second section 8, as its purpose is to disrupt a laminar boundary layer of exhaust gas 9 along the wall of the exhaust conduit 2.

Exemplified in FIG. 2, two connection devices 20 are connected to the third section 10 and the fourth section 11 respectively, the connection devices 20 connecting the sections 10, 11 to a surface via a vibrational damping portion 21. The connection devices 20 in FIG. 2 are merely represented for illustrative purposes, and may comprise a clamp or any other similar devices suited to fasten and hold the sections 10, 11, with a spring, flexible body or similar suited device comprising the vibrational damping portion 21.

In other aspects of the invention, a single connection device 20 may connect both the third section 10 and the fourth section 11 together. Several connection devices 20 may also be arranged in parallel along the sections 10, 11. The surface onto which the connection devices 20 are fitted may be a roof, ceiling or wall external to the exhaust conduit and electric energy generating device, so as to prevent vibrations propagating to the thermoelectric generator. In some aspects, connection devices 20 may be connected to several surfaces. Dependent on the external system, the arrangement of the connection devices 20 will be adapted as will be apparent to the skilled person based on the disclosure of the invention herein.

FIG. 3 illustrates an aspect of the invention, exemplified by an electric energy generating device 1 comprising two heat transfer loops 6 on a hot side 4 of the thermoelectric generator 3, the hot side heat transfer loops 6 being arranged to extend into an exhaust conduit 2. Correspondingly two heat transfer loops 13 are arranged on the cold side 5 of the thermoelectric generator 3, the cold side heat transfer loops 13 extending through a cooling reservoir 14. The number of loops is not limited to two on each side, nor does the number of loops 6, 13 on each side have to be similar. A device may have 1, 2, 3, 4, 5, 6, 7, 8, 9, 10 or any higher suitable number of independent loops 6, 13 on each side of the thermoelectric generator 3.

The configuration of the heat transfer loops 6, 13 is dependent on the exhaust system in which the electric energy generating device 1 is to be installed. In some cases there may be existing heat exchangers, such as economizers, installed in the exhaust conduit. In such cases the electric energy generating device 1 may be installed in connection with these existing systems, configuring the heat transfer loops 6, 13 accordingly.

In one aspect of the invention, exemplified in FIG. 4, two electric energy generating devices 1 are installed in an exhaust conduit 2 of a ship. Heat exchangers are commonly found on ships and other offshore constructions, where they utilize ambient water to cool down systems on the ship via the heat exchanger. Though FIG. 4 schematically illustrates separate heat exchangers 15 for the devices 1, a plurality of devices may also be connected to a common heat exchanger 15. Dependent on the system where an electric energy generating device is to be installed, the device is configured with features that best complement the existing system.

Figure 5:
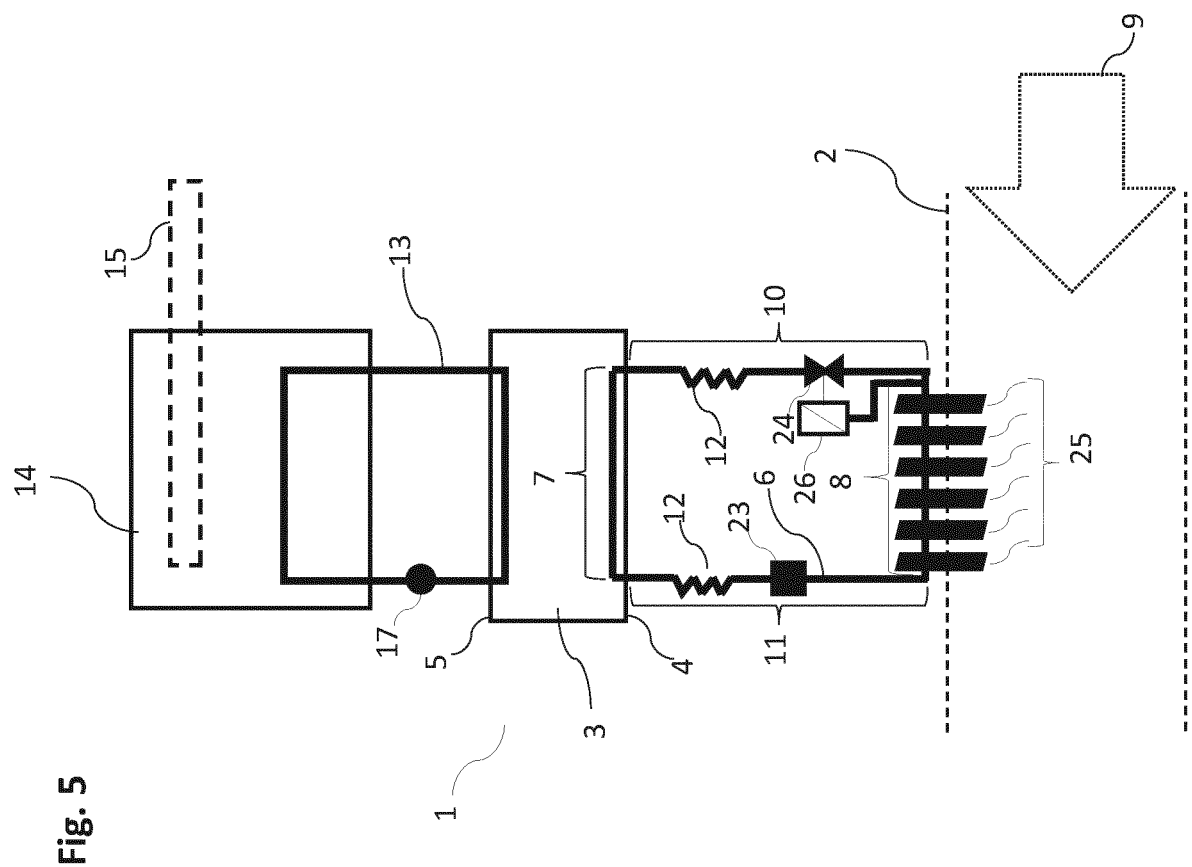
FIG. 5 schematically illustrates an aspect of the invention, where an electric energy generating device comprising a heat pipe is arranged above an exhaust gas conduit, and where the third section comprises a control valve connected to the second section.

FIG. 5 illustrates an aspect of the invention, where the second section 8 of the heat transfer loop 6 comprises heat exchanging elements 25 comprising thermal plates and which are arranged to extend inside the exhaust conduit 2. The thermal fluid may typically circulate through the heat exchanging elements 25 extending into the exhaust conduit, and thus the heat exchanging elements 25 may act as evaporators, evaporating the thermal fluid and ensuring the thermal fluid in the second section 8 of the hot side heat transfer loop 6 is in thermal contact with the exhaust gas 9.

FIG. 5 furthermore illustrates an aspect, where the first section 7 of the hot side heat transfer loop 6 is gravitationally arranged above the second section 8. In the example shown in FIG. 5, the exhaust gas conduit is illustrated in a horizontal direction, however the first section 7 may be arranged gravitationally above the second section 8 also where the exhaust gas conduit is not horizontal, such as vertical or arranged in any angle in-between horizontal and vertical. Notably, in such aspects, the hot side heat transfer loop 6 may comprise a heat pipe, which does not require a pumping means to circulate the fluid within. Instead, the thermal fluid evaporates as it passes the second section 8 where heat is transferred to the fluid, whereupon the fluid rises to the first section 7 where it gives off heat to the thermoelectric generator 3 and condenses as a result. The condensed thermal fluid will then flow back down to the second section 8 again, and the process repeats.

An aspect of the invention is exemplified in FIG. 5, where a control valve 24 is arranged on the hot side heat transfer loop 6. The control valve is typically arranged between the second section 8 and the first section 7. In the aspect illustrated in FIG. 5, the control valve 24 is arranged on the third section, i.e. downstream of the second section 8 where the thermal fluid has been heated by the exhaust gas 9. A control unit 26 is coupled to the second section 8, and may for example actuated by temperature such as a thermostat, a spring based pressure valve or a combination as is known in the art. When the control unit 26 actuates the valve 24, to decrease or shut down volume flow through the third section 10, pressure will build up in the second section 10 which will result in liquid in the receiver tank 23 being pushed back into the first section 7 and thereby provide additional cooling to the hot side 4 of the thermoelectric generator.

Figure 6:
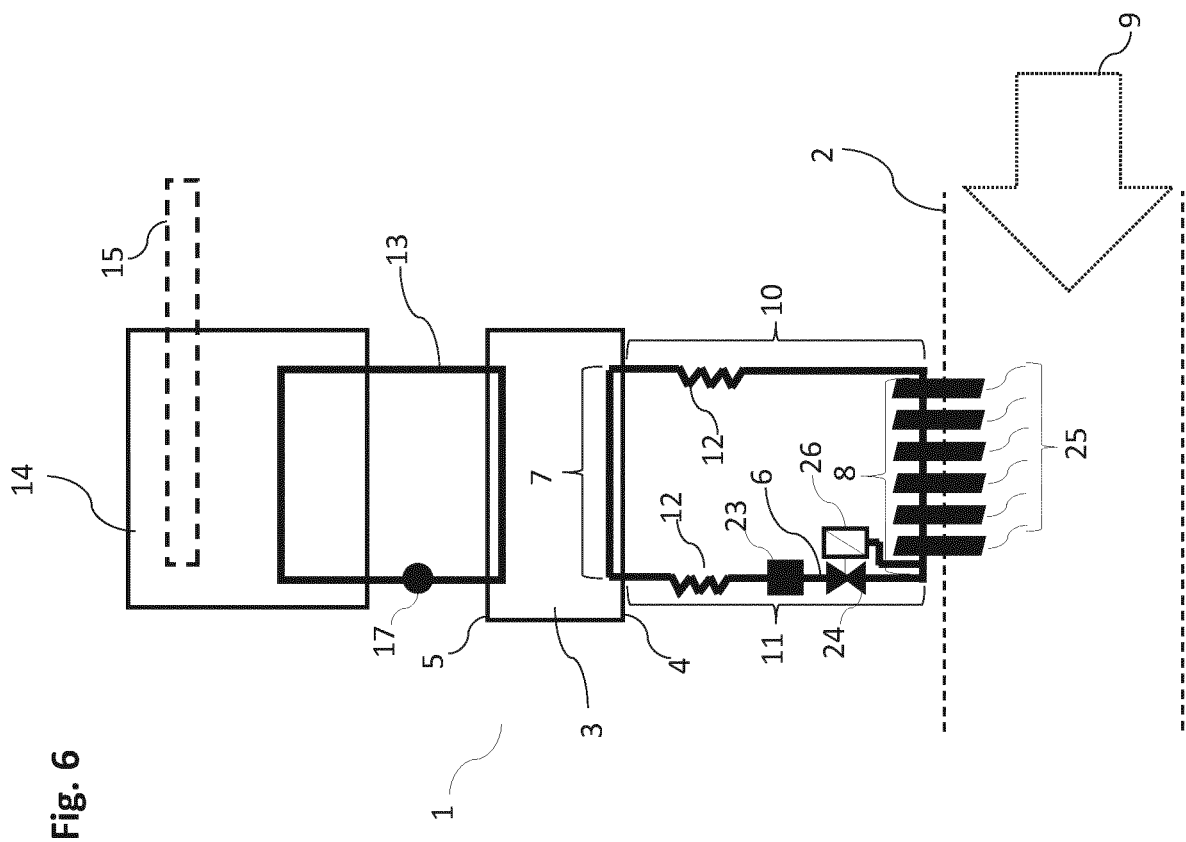
FIG. 6 schematically illustrates an aspect of the invention, where an electric energy generating device comprising a heat pipe is arranged above an exhaust gas conduit, and where the fourth section comprises a control valve connected to the second section.

Another aspect of the invention is exemplified in FIG. 6, where the control valve 24 is arranged on the fourth section, i.e. upstream of the second section 8. A control unit 26 is coupled to the second section 8, and which when actuated, causes a buildup of pressure and thereby liquid in the first section 7 such that thermal resistance increases.

Figure 7:
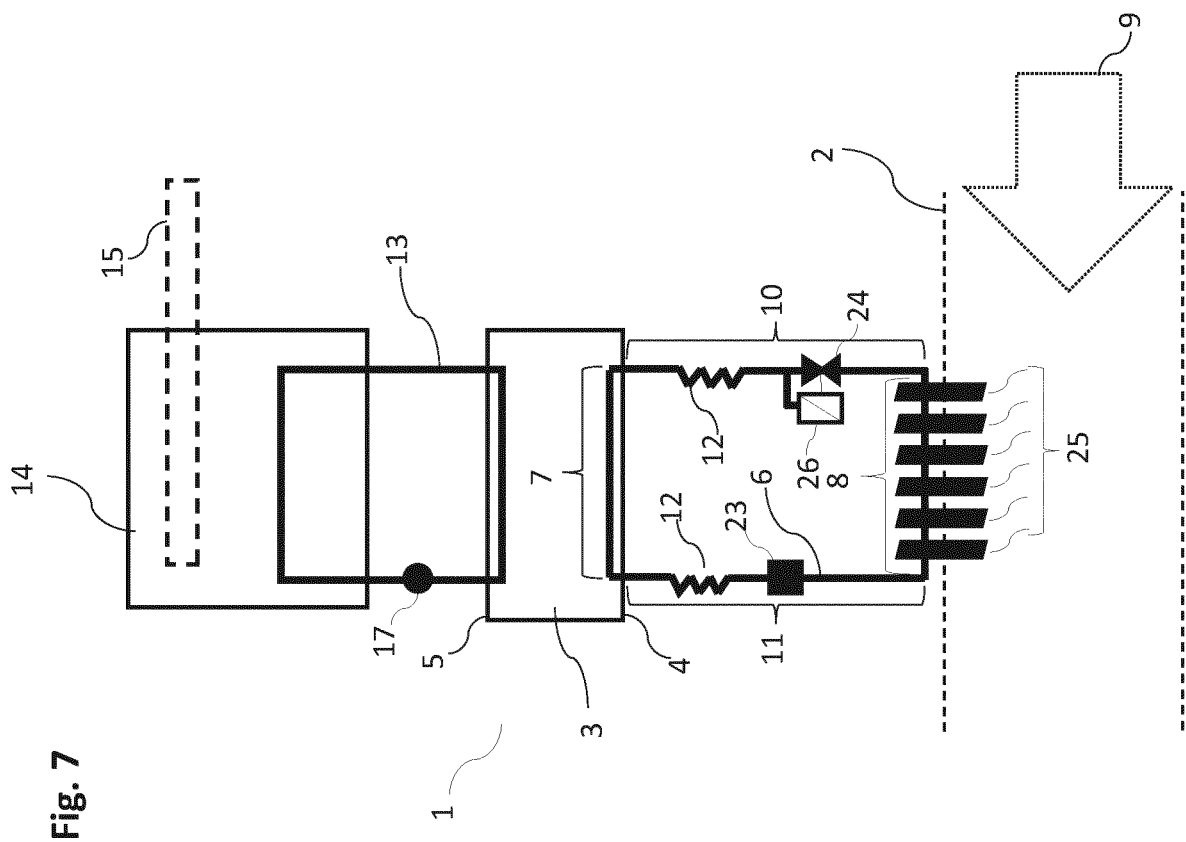
FIG. 7 schematically illustrates an aspect of the invention, where an electric energy generating device comprising a heat pipe is arranged above an exhaust gas conduit, and where the third section comprises a control valve connected to the third section.

Another aspect of the invention is exemplified in FIG. 7, where the control valve 24 is arranged on the third section. In this aspect, a control unit 26 is coupled to the third section downstream of the control valve 24. Thus, when actuating the control valve 24, the flow of thermal fluid into the first section 7 may be controlled thereby controlling the temperature of the hot side 4 of the thermoelectric generator directly.

Figure 8:
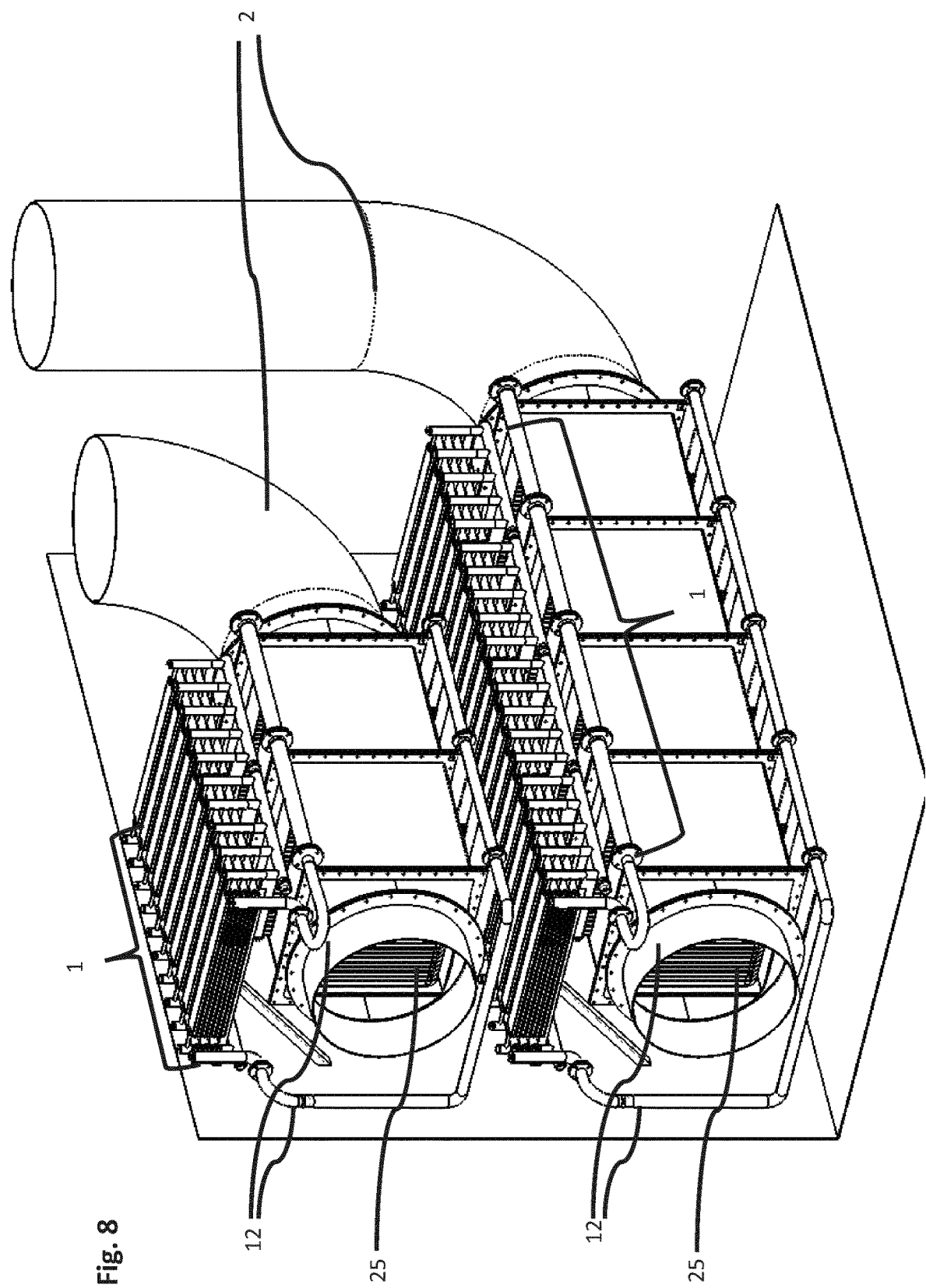
FIG. 8 is a perspective view of two systems comprising a plurality of thermoelectric generators arranged gravitationally above two exhaust conduits.

FIG. 8 is a perspective view of an example of the invention, where two systems comprising a plurality of thermoelectric generators are installed on two exhaust conduits 2. As with the examples in FIGS. 5-7, the example in FIG. 8 illustrates the thermoelectric generators 1 and the first section 7 arranged gravitationally above the second section 8, such that the thermal fluid may evaporate in the heat exchanging elements 25, rise up to the first section 7 and condense before draining back down to the second section again. Although the thermoelectric generators 1, and the heat exchanging elements 25 are exemplified as being arranged in a vertical orientation, it should be noted that a horizontal orientation is also possible, and that they may be arranged in different locations and also on vertical exhaust conduits 2, though this is not illustrated herein.

The invention is herein described in non-limiting embodiments and variations. A person skilled in the art will understand that there may be made alterations and modifications to the embodiments and variations that are within the scope of the invention as described in the attached claims.

REFERENCE SIGNS LIST

1. Electric energy generating device
2. Exhaust conduit
3. Thermoelectric generator
4. Hot side of generator
5. Cold side of generator
6. Hot side heat transfer loop
7. First section of loop
8. Second section of loop
9. Exhaust gas
10. Third section of loop
11. Fourth section of loop
12. Vibrational damping parts
13. Cold side heat transfer loop
14. Cooling reservoir
15. Heat exchanger
16. Fluid pumping device hot side loop
17. Fluid pumping device cold side loop
18. System for generating electric power
19. Combustion engine
20. Connection device
21. Connection device vibration damping portion
22. Turbulence inducing device
23. Expansion tank
24. Control valve
25. Heat exchanging element
26. Control unit

The invention claimed is:

1. An electric energy generating device for installation to an exhaust conduit in which an exhaust gas is flowing, characterised in that the device comprises;
    a thermoelectric generator comprising a hot side and a cold side,
    at least one hot side heat transfer loop comprising a fluid conduit circuit having a thermal fluid circulating therein, and where the fluid conduit circuit comprises;
        a first section in thermal contact with the hot side of the thermoelectric generator,
        a second section adapted to be in thermal contact with the exhaust gas,
        a third section located between the first section and the second section upstream of the first section and a fourth section located between the first section and the second section downstream of the first section,
        wherein the third section and the fourth section are thermally insulated, and each comprise:
            at least one vibrational damping part, wherein each of the at least one vibrational damping part comprises a heat resistant and flexible tube integrated into the third section and the fourth section of the fluid conduit circuit, and
            at least one connection device to connect the third section and the fourth section to a surface external to the device and the exhaust conduit, wherein each of the at least one connection device comprises a vibrational damping portion,
    at least one cold side heat transfer loop arranged on the cold side of the thermoelectric generator, the at least one cold side heat transfer loop being in thermal communication with a cooling reservoir.

2. The device according to claim 1, wherein the fluid conduit circuit comprises a control valve.

3. The device according to claim 1, wherein the third section and fourth section are adapted to be arranged externally to the exhaust conduit.

4. The device according to claim 1, wherein the at least one hot side heat transfer loop is a heat pipe.

5. The device according to claim 4, wherein the first section is arranged above the second section.

6. The device according to claim 1, wherein the second section is adapted to be arranged externally to the exhaust conduit.

7. The device according to claim 6, wherein the second section is in thermal contact with at least one heat exchanging element, the heat exchanging element being adapted to extend internally into the exhaust conduit, such that the at least one heat exchanging element is directly exposed to the exhaust gas.

8. The device according to claim 1, wherein at least one first part of the second section is adapted to extend internally into the exhaust conduit, such that the at least one first part of the second section is directly exposed to the exhaust gas.

9. The device according to claim 8, wherein the surface of the second section's at least one first part comprises any of: plates, fins, turbulator wires and heat pipes.

10. The device according to claim 1, wherein at least one second part of the second section is adapted to any of: lie inside a wall of the exhaust conduit and lie against an external wall of the exhaust conduit, such that the at least one second part is not directly exposed to the exhaust gas.

11. The device according to claim 1, wherein at least one turbulence inducing device is arranged on an internal wall of the exhaust conduit adjacent or directly upstream to the second section.

12. The device according to claim 1, wherein the at least one cold side heat transfer loop comprises a fluid pumping device for circulating a thermal fluid contained in the loop.

13. The device according to claim 1, wherein the cooling reservoir is adapted to be arranged in thermal communication with a heat exchanger external to the device.

14. A system for generating electric power from the exhaust of a combustion engine, comprising at least one electric energy generating device according to any of the preceding claims.

15. The system according to claim 14, comprising a heat exchanger in thermal communication with the cooling reservoir of the device.

16. The system according to claim 14, where several electric energy generating devices are arranged substantially longitudinally parallel and/or substantially in a downstream extending series in the exhaust conduit.

* * * * *